(12) United States Patent
Tatartchenko

(10) Patent No.: US 6,929,693 B2
(45) Date of Patent: Aug. 16, 2005

(54) SINGLE CRYSTALS, METHOD FOR MAKING SINGLE CRYSTALS BY GROWTH IN SOLUTION AND USES

(75) Inventor: Vitali Tatartchenko, Nashua, NH (US)

(73) Assignee: Saint-Gobain Cristaux & Detecteurs, Courbevoie (FR)

( * ) Notice: Subject to any disclaimer, the term of this patent is extended or adjusted under 35 U.S.C. 154(b) by 224 days.

(21) Appl. No.: 10/415,351

(22) PCT Filed: Nov. 7, 2001

(86) PCT No.: PCT/FR01/03442

§ 371 (c)(1),
(2), (4) Date: May 6, 2003

(87) PCT Pub. No.: WO02/38836

PCT Pub. Date: May 16, 2002

(65) Prior Publication Data

US 2004/0011278 A1 Jan. 22, 2004

(30) Foreign Application Priority Data

Nov. 9, 2000 (FR) .......................................... 00 14423

(51) Int. Cl.⁷ ................................................ C30B 7/08
(52) U.S. Cl. ........................... 117/68; 117/69; 117/70; 117/902; 117/948
(58) Field of Search ............................ 117/68, 69, 70, 117/71, 902, 948

(56) References Cited

U.S. PATENT DOCUMENTS

| 4,517,048 A | * | 5/1985 | Shlichta ........................ 117/68 |
| 4,670,117 A | * | 6/1987 | Yoshida et al. .............. 204/523 |
| 5,904,772 A | * | 5/1999 | Montgomery et al. ...... 117/206 |

FOREIGN PATENT DOCUMENTS

EP 0 586 366 3/1994
FR 2 764 909 12/1998

OTHER PUBLICATIONS

NP Zaitseva et al.: "Rapid growth of large–scale (40–55 cm) K2PO4 crystals" Journal of Crystal Growth, vol. 180, no. 2, pp. 255–262.

Osamu Shimomura: "Growth and evaluation of large KDP single crystals for high–power harmonic generation by temperature decrease and method" Electronics & Communications in Japan, Part II—Electronics, vol. 71, pp. 91–100 1988.

Opilski et al.: "The crystal growth kinetics of ammonium dideuterium arsenale" Journal of Crystal Growth, vol. 29, pp. 173–175 1975.

* cited by examiner

*Primary Examiner*—Robert Kunemund
(74) *Attorney, Agent, or Firm*—Oblon, Spivak, McClelland, Maier & Neustadt, P.C.

(57) ABSTRACT

The invention relates to a tetragonal single crystal (1, 11) of composition:

$$Z(H,D)_2MO_4$$

where Z is an element or a group of elements, or a mixture of elements and/or of groups of elements chosen from the group K, $N(H,D)_4$, Rb, Ce where M is an element chosen from the group P, As and where (H,D) is hydrogen and/or deuterium comprising an approximately parallelepipedal region of large dimensions, especially one in which the length of each of the edges of the faces, AC1, AC2, AC3, is greater than or equal to 200 mm, in particular greater than or equal to 500 mm, which crystal is obtained by crystal growth from solution, from an approximately parallelepipedal single-crystal seed (2, 22) whose edges of the faces have lengths of AG1, AG2, AG3.

26 Claims, 5 Drawing Sheets

Figure 1:
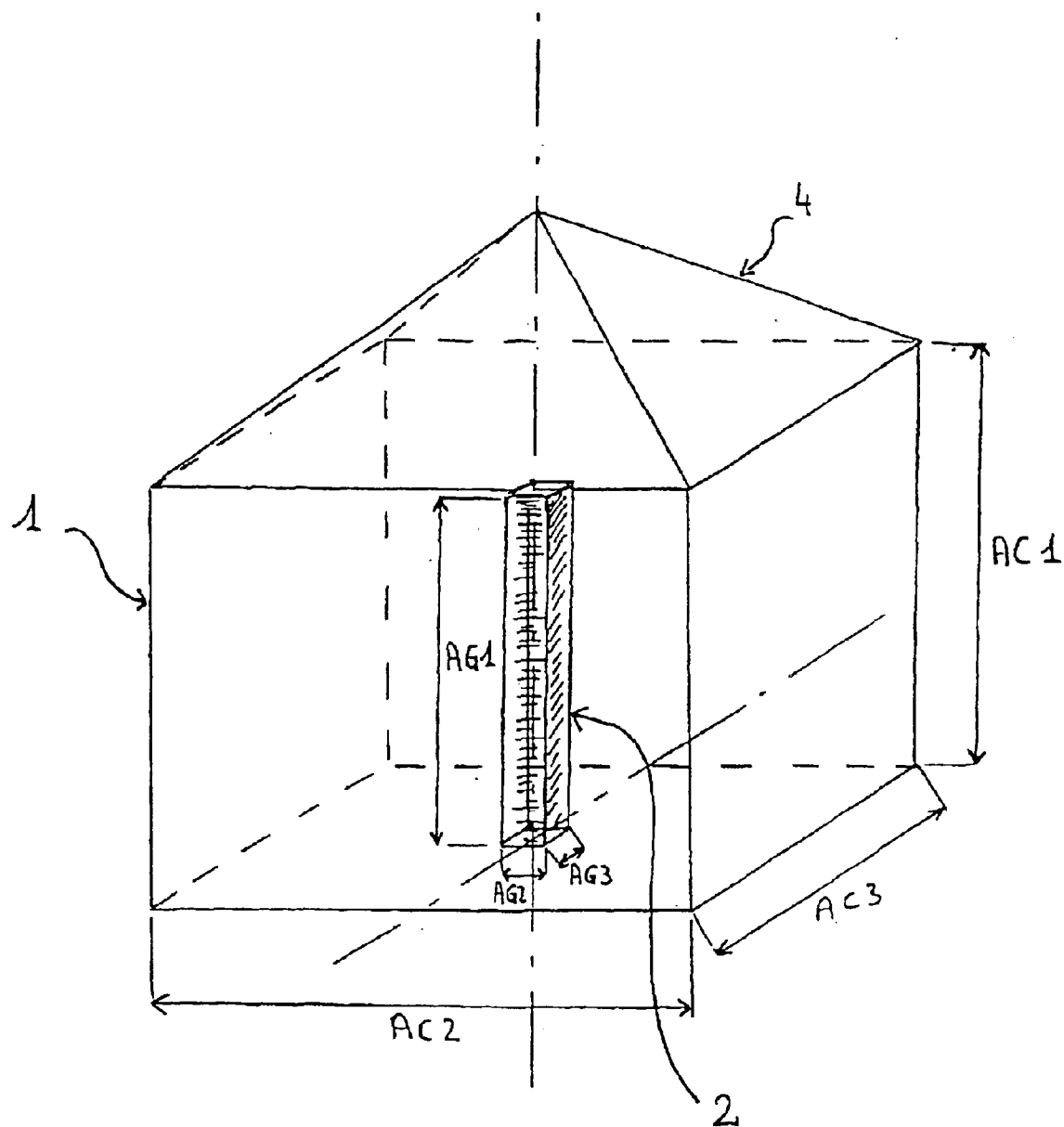
Figure 2:
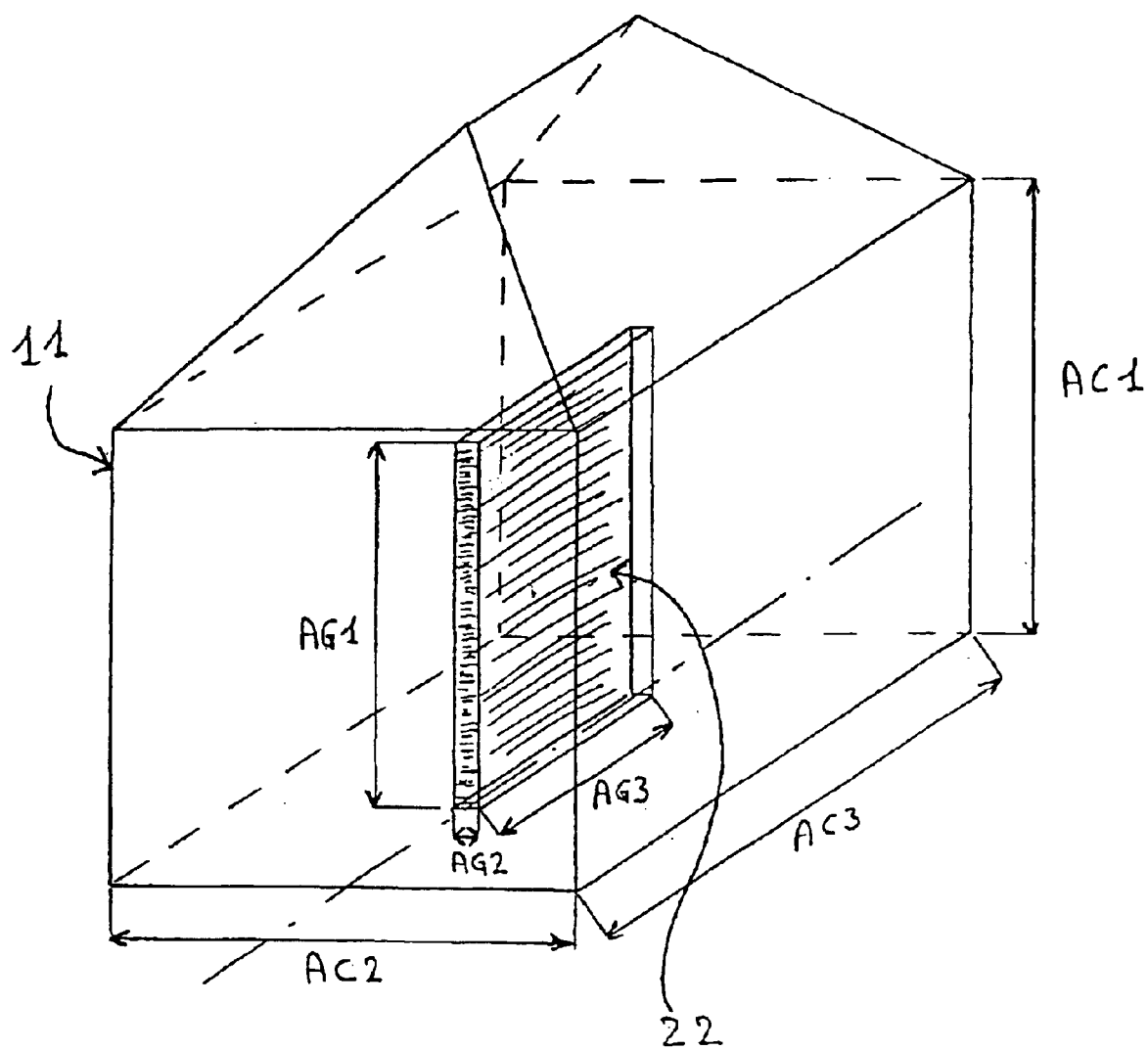

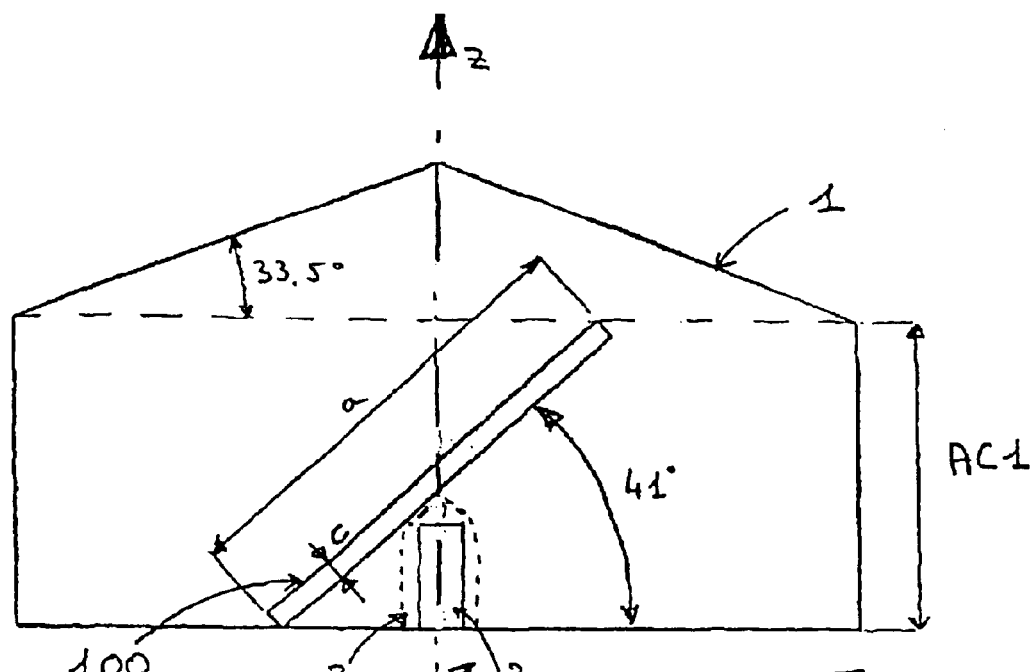
Fig 4-1
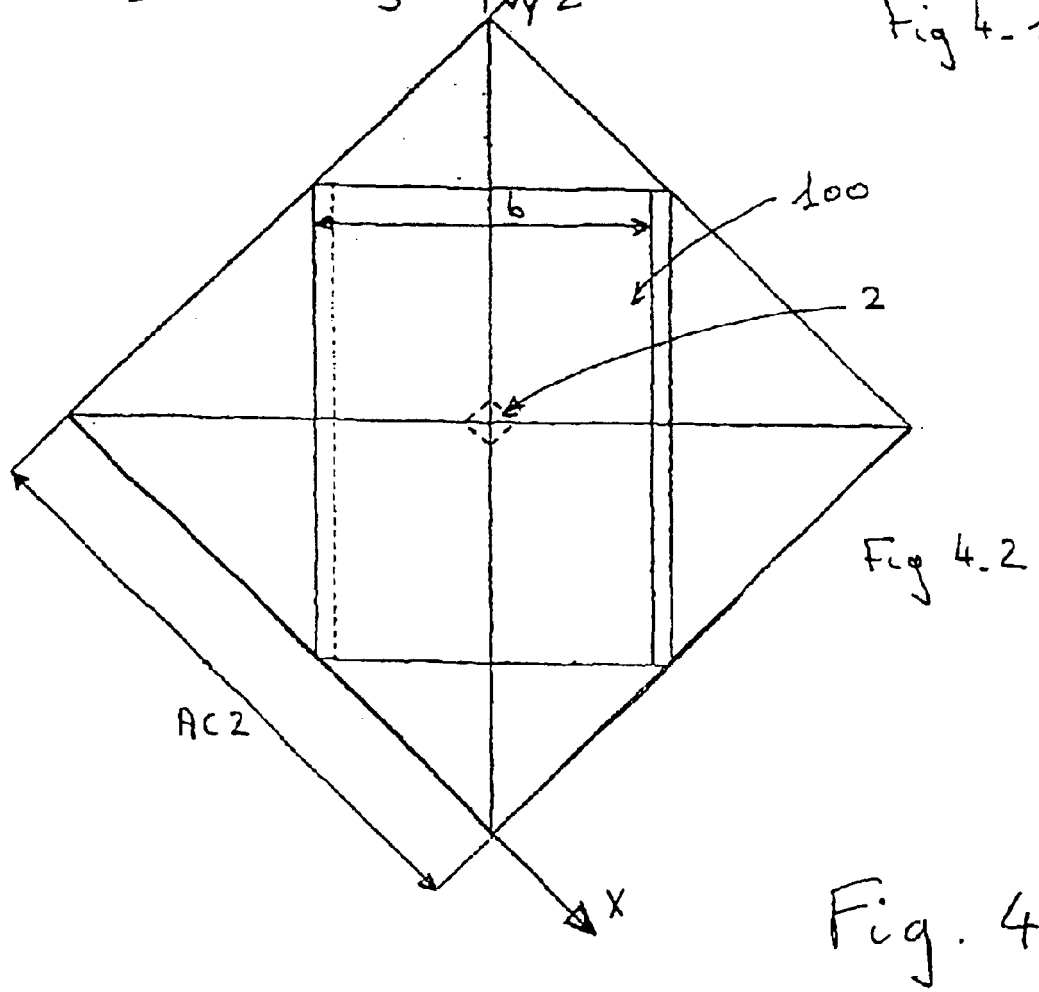
Fig 4-2
Fig. 4

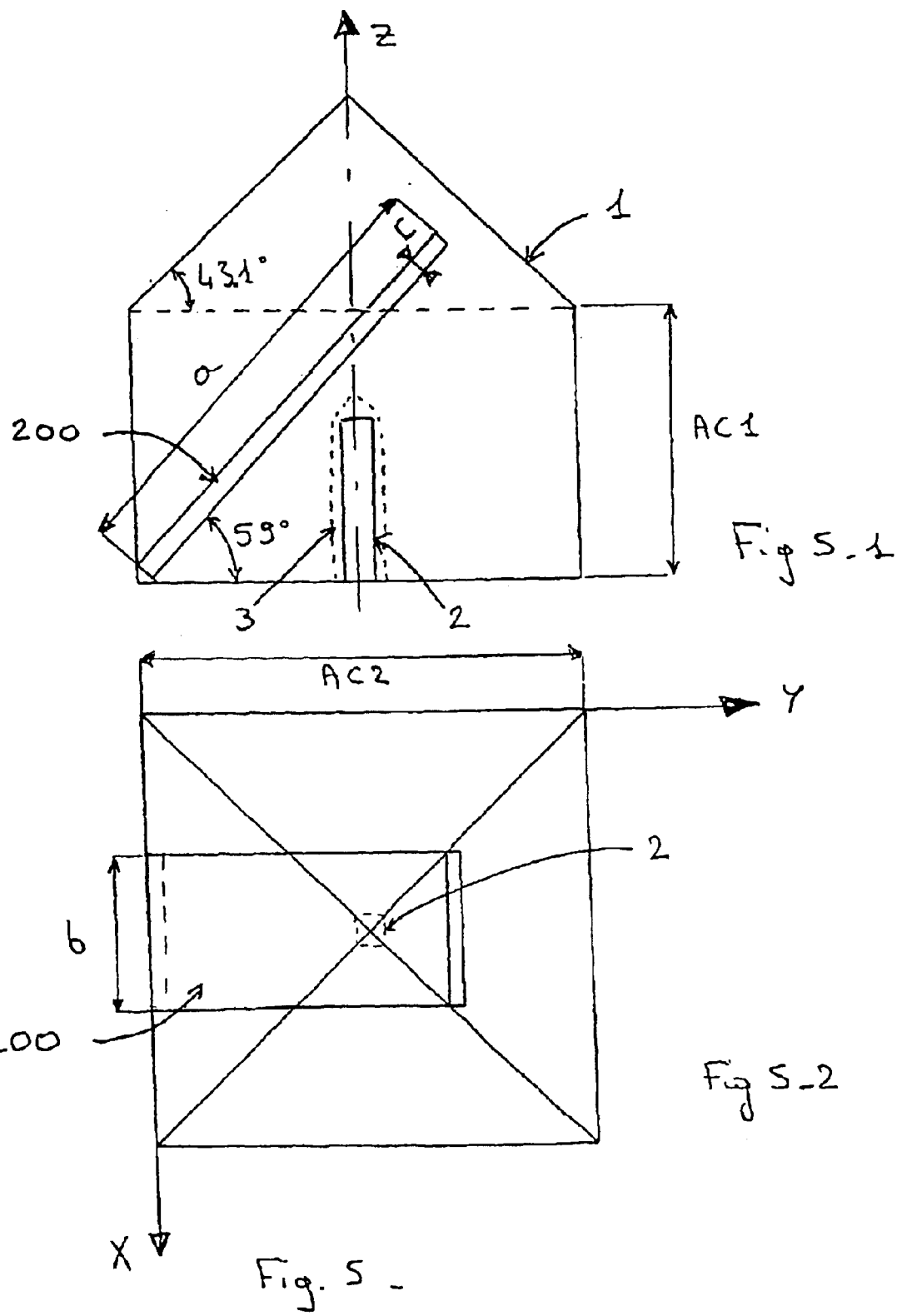

SINGLE CRYSTALS, METHOD FOR MAKING SINGLE CRYSTALS BY GROWTH IN SOLUTION AND USES

The invention relates to the field of single crystals and more particularly to large tetragonal single crystals. It also relates to a growth process for obtaining said single crystals and to a process for manufacturing single-crystal plates obtained from the single crystals manufactured by the growth method. It also relates to the applications and uses of said single-crystal plates, especially as optical components, in particular as laser components.

Crystals of the type of those of the invention have been especially developed to meet the demands of high-power laser manufacturers who require large optical components.

This is because, in the context of research on nuclear fusion by inertial confinement, projected lasers require the production of large KDP (potassium dihydrogen phosphate, $KH_2PO_4$) single crystals. These crystals are used either as an optical switch (in the form of a Pockels cell) or as a frequency doubler or tripler for the light emitted by the laser source. It is also possible to use crystals of deuterated potassium phosphate or DKDP.

Further crystal compositions are presently being studied.

The crystals, especially KDP crystals, are produced in the form of boules from which plate-shaped pieces are cut, which will thus be used in the apparatuses in question. In the case of a Pockels cell, a plate cut perpendicular to the Z axis of the crystal is used. In the case of a frequency multiplier, the plate is cut in a well defined direction, known to those skilled in the art. For example, for a frequency doubler a plate is cut which has its large face lying in a plane at 41° to the XY plane and which cuts this XY plane at points equidistant from the origin along the X axis and along the Y axis, as may be seen in FIG. 4, and, for a frequency tripler, a plate is cut which has its large face lying at 59° to the XY plane and which cuts this XY plane along a line parallel to the X axis, as may be seen in FIG. 5.

Known methods for growing large tetragonal single crystals are described, for example, in the publication by Zaitseva et al., "Rapid growth of large-scale (40–55 cm) $KH_2PO_4$ crystals", *Journal of Crystal Growth* 180 (1997), 255–262.

Large-scale tetragonal single crystals are understood to mean single crystals in which each of the edges of the faces, denoted AC1, AC2, AC3, have a length greater than or equal to 100 mm, especially greater than or equal to 200 mm and even, in particular, greater than or equal to 500 mm.

In the above publication, crystals of this type are obtained by growth from solution, from a point seed, that is to say a single crystal whose size is small compared with the size of the crystal that it is desired to obtain, especially with a seed size of the order of 1 $cm^3$. Furthermore, the lengths of the edges of the seed are all approximately equal. In this technique, and using a supersaturated solution as described in the publication, it is possible to obtain a tetragonal crystal about 450 mm in length in the X, Y and Z directions in 30 days. This method will hereafter be referred to as the "reference method".

This technique, although having been the first to allow the manufacture of large-scale tetragonal single crystals, has several drawbacks.

This is because with the ever increasing power of lasers, the size of the desired optical components increases, and it is now desired to obtain plates for laser components two of whose dimensions are greater than 400 mm. This requires the production of boules having at least a base of 600 mm per side and of sufficiently large height to extract the desired plates.

It is conceivable to increase the size of the apparatus in which the crystals grow. However, this increase in size comes up against technical problems difficult to solve. This is because, as described below, growth takes place from the solution contained in a crystallizer, generally made of glass. However, it becomes very expensive to obtain crystallizers of large size, especially having a diameter of more than one meter, and it is necessary to have a very large volume of solution. Another technical problem relates to the fact that, to increase the size of the crystals with the reference method it is necessary to increase the growth time. This increase in the growth time can lead to defects highly damaging for the crystals obtained, since the probability of developing spurious crystals from seeds in the solution or from the free surfaces of the growth apparatus, which surfaces may constitute seeds, considerably increases with the growth time.

Furthermore, the extraction yield, defined as being the ratio of the volume of plates useful as optical components to the volume of the boule from which they are extracted with the reference method, is generally low, often of the order of 10%.

The object of the present invention is to remedy the abovementioned drawbacks, especially by making it possible to increase the extraction yield of the plates used as optical components extracted from a boule, while continuing to use growth apparatuses of reasonable size which allow, in particular, the volume of solution needed for growing a boule to be limited.

The problem of obtaining a single-crystal boule with a growth apparatus of reasonably large size, from which a large number of plates can be extracted, is solved by the use of a seed of particular shape and dimensions.

One subject of the present invention is a tetragonal single crystal of composition:

$$Z(H,D)_2MO_4$$

where Z is an element or a group of elements, or a mixture of elements and/or of groups of elements chosen from the group K, $N(H,D)_4$, Rb, Ce where M is an element chosen from the group P, As and where (H,D) is hydrogen and/or deuterium comprising an approximately parallelepipedal region of large dimensions, especially one in which the length of each of the edges of the faces, AC1, AC2, AC3, is greater than or equal to 200 mm, in particular greater than or equal to 500 mm, which crystal is obtained by crystal growth from solution, from an approximately parallelepipedal single-crystal seed whose edges of the faces have lengths of AG1, AG2, AG3, where at least the length of one edge, AG1, of the seed is greater than or equal to one tenth, preferably one quarter, of the length of one edge of the faces of the single crystal and where at least one other length of the seed, AG3, is less than or equal to one fifth, preferably one tenth, of the greatest length of the edges of the faces of the seed.

This tetragonal single crystal may serve as a boule from which single-crystal plates will be cut.

This tetragonal single crystal may especially be of composition $KH_2PO_4$ (known by the abbreviation KDP), K(H,D)$_2PO_4$ (DKDP, that is to say deuterated KDP), $(NH_4)H_2PO_4$ (ADP) and $N(H,D)_4(H,D)_2PO_4$ (DADP or deuterated ADP).

It is also possible to obtain crystals of composition Rb(H,D)$PO_4$ and CE(H,D)$PO_4$ (deuterated or nondeuterated).

We should point out that, for some applications, it is beneficial to use substitutions or mixtures based on elements or associated groups of elements from K, $N(H,D)_4$, Rb, and Ce.

Crystals having the same structure can also be obtained by replacing P with As for all the abovementioned compositional variants of the crystal.

It is thus possible to define the "KDP family" as described in the work "KDP—a family of single crystals" by L. N. Rashkovich (Adam Hilger IOP Publishing Limited, 1991) and especially as noted, for example, in the following publications: Landolt-Börnstein, 1984 (*Numerical Data and Functional Relationships in Science and Technology*, New Series, Vol. 18—suppl. to vol. III/11, edited by K-H Hellwege and A. M. Hellwege, published by Springer, Berlin), D. Eimerl, 1987 (1987a "*Electro optic, linear and nonlinear optical properties of KDP and its isomorphs*", *Ferroelectrics*, 72, 95–130 and 1987b "High average power harmonic generation", *IEEE J. Quantum Electron.*, QE-23 575–92) and E. Courtens, 1987 ("Mixed crystals of the $KH_2PO_4$ family", *Ferroelectrics*, 72, 229–44).

It is known that a tetragonal crystal is composed of an approximately parallelepipedal region and at least one of these faces may be extended by a pyramid, the edges of the base of which correspond to the edges of said face.

According to a preferred embodiment of the invention, the seed is a rod, the two lengths of the shortest edges of which, AG2, AG3, are approximately equal to each other and less than or equal to one fifth, preferably one tenth, of the length of the longest edge, AG1, of the rod.

The expression "approximately equal lengths" is understood here and in the rest of the text to mean lengths which are of the same order of magnitude, especially where one length is at most twice the other.

According to another embodiment of the invention, the seed is a plate, the lengths of the two longest edges of which, AG3, AG1, are approximately equal to each other and greater than or equal to five times, preferably ten times, the length of the shortest edge, AG2, of the plate.

According to an advantageous variant of the invention, the single-crystal seed is a tetragonal single crystal of composition:

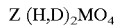

$Z(H,D)_2MO_4$ where Z is an element or a group of elements, or a mixture of elements and/or of groups of elements chosen from the group K, $N(H,D)_4$, Rb, Ce
where M is an element chosen from the group P, As and where (H,D) is hydrogen and/or deuterium.

According to one embodiment of the invention, the tetragonal single crystal that can be especially used as a boule, from which plates of single crystals are cut, and the single-crystal seed have the same chemical composition.

The invention also relates to a process for manufacturing a tetragonal single crystal by growth from solution, from an approximately parallelepipedal single-crystals seed, the edges of the faces of which have lengths of AG1, AG2 and AG3, which is supported on a platform immersed in the solution and set in rotation, said single crystal having growth rates (Vx, Vy, Vz) of the same order of magnitude along the principal crystallographic axes (X, Y, Z), especially where the slowest growth rate is greater than or equal to one quarter, especially one half, of the fastest growth rate, which process comprises at least the following steps:

the seed is cut from a single crystal so that at least one length of the edges, AG3, of the seed is less than or equal to one fifth, preferably one tenth, of the geatest length of the edges of the seed, AG1, and so that at least one length of the edges of the seed is greater than or equal to 25 mm, especially greater than or equal to 50 mm;

the seed is positioned on the platform in the desired orientation; and the platform with the seed is put into a crystallizer containing the solution and then set in rotation, in order to carry out the growth of the single crystal.

This manufacturing process makes it possible to obtain large single crystals which can be used as boules from which plates of single crystals will be cut.

The single-crystal seed may be cut, for example, either from a single crystal obtained according to a known growth method or from a single crystal grown beforehand using the abovementioned method.

It is known to those skilled in the art that the characteristics of a tetragonal crystal are defined by the crystallographic axes X, Y, Z. The growth rate of the faces of this crystal along the X, Y, Z axis are called Vx, Vy, Vz, respectively.

According to a preferred embodiment, the seed is placed so that the growth axes X, Y, Z coincide with those of the edges of the seed.

According to a preferred variant of the invention, the seed used in the process below is a rod, the lengths of the two shortest edges of which, AG2, AG3, are approximately equal to each other and less than or equal to one fifth, preferably one tenth, of the length of the longest edge, AG1, of the rod.

A single crystal, able to be used as a boule, at least two dimensions of which are substantially equal, is thus obtained.

According to another variant of the process according to the invention, the seed is a plate, the lengths of the two longest edges of which, AG3, AG1, are approximately equal to each other and greater than or equal to five times, preferably ten times, the length of the shortest edge, AG2, of the plate.

A single crystal that can be used as a boule, at least one dimension of which is less than the other two, is therefore obtained.

The latter two variants are cited as preferred examples of implementation, but variants should not be excluded in which the seed has an intermediate configuration between a rod and a plate.

According to one method of implementing the process according to the invention, the single-crystal seed is a tetragonal single crystal of composition:

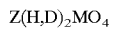

$Z(H,D)_2MO_4$ where Z is an element or a group of elements, or a mixture of elements and/or of groups of elements chosen from the group K, $N(H,D)_4$, Rb, Ce
where M is an element chosen from the group P, As and where (H,D) is hydrogen and/or deuterium.

According to one way of implementing the process according to the invention, the tetragonal single crystal obtained by growth from solution has the same chemical composition as the single-crystal seed.

According to an advantageous variant of the process according to the invention, the solution is supersaturated, especially with a supersaturation a of between 0.1% and 20%.

The notion of supersaturation is known to those skilled in the art and defined, for example in the abovementioned article by Zaitseva et al, as:

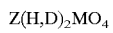

$$\sigma = \frac{C - C_0}{C_0}$$

where C corresponds to the concentration of the solution and $C_0$ corresponds to the equilibrium concentration of the solution.

It should be noted that the preferred supersaturation range can be divided into two particularly advantageous sub-ranges:

firstly, a low supersaturation range, especially for σ between 0.1 and 0.5%, which results in slow growth of the crystals and makes it possible to obtain crystals of remarkable optical quality and secondly, a high supersaturation range, especially for σ between 1 and 20%, and makes it possible to obtain high growth rates.

According to one method of implementing the process according to the invention, the single crystal obtained is of composition:

$Z(H,D)_2MO_4$ where Z is an element or a group of elements, or a mixture of elements and/or of groups of elements chosen from the group K, $N(H,D)_4$, Rb, Ce
where M is an element chosen from the group P, As and where (H,D) is hydrogen and/or deuterium.

It should be noted that it may be advantageous to use a seed having a composition different from that of the single crystal that it is desired to obtain.

For example, a KDP seed may be used in order to grow a DKDP crystal.

Other configurations are possible, as long as the chemical and crystallographic compatibility between the seed and the crystal is maintained.

The invention also relates to a process for manufacturing at least one tetragonal single crystal, in which a single crystal obtained using the process described above, called a boule, is used and in which at least one single-crystal plate is cut from a region sufficiently far from the seed and from the regeneration region in order to obtain optical properties allowing the plate(s) to be used as a laser component.

The term "regeneration region" refers to the region around the seed, corresponding to a first growth phase of the crystal from the seed, especially to the pyramid which forms on the face perpendicular to the Z axis of the seed and to a region, contiguous with the faces of the seed, which may be estimated to be in general 20% of the shortest length of the seed.

The crystal plates thus obtained are of excellent optical quality and can be especially used for laser applications, particularly as Pockels cells, or as a frequency doubler or frequency tripler depending on the orientation of the cut made in the boule.

Figure 3:
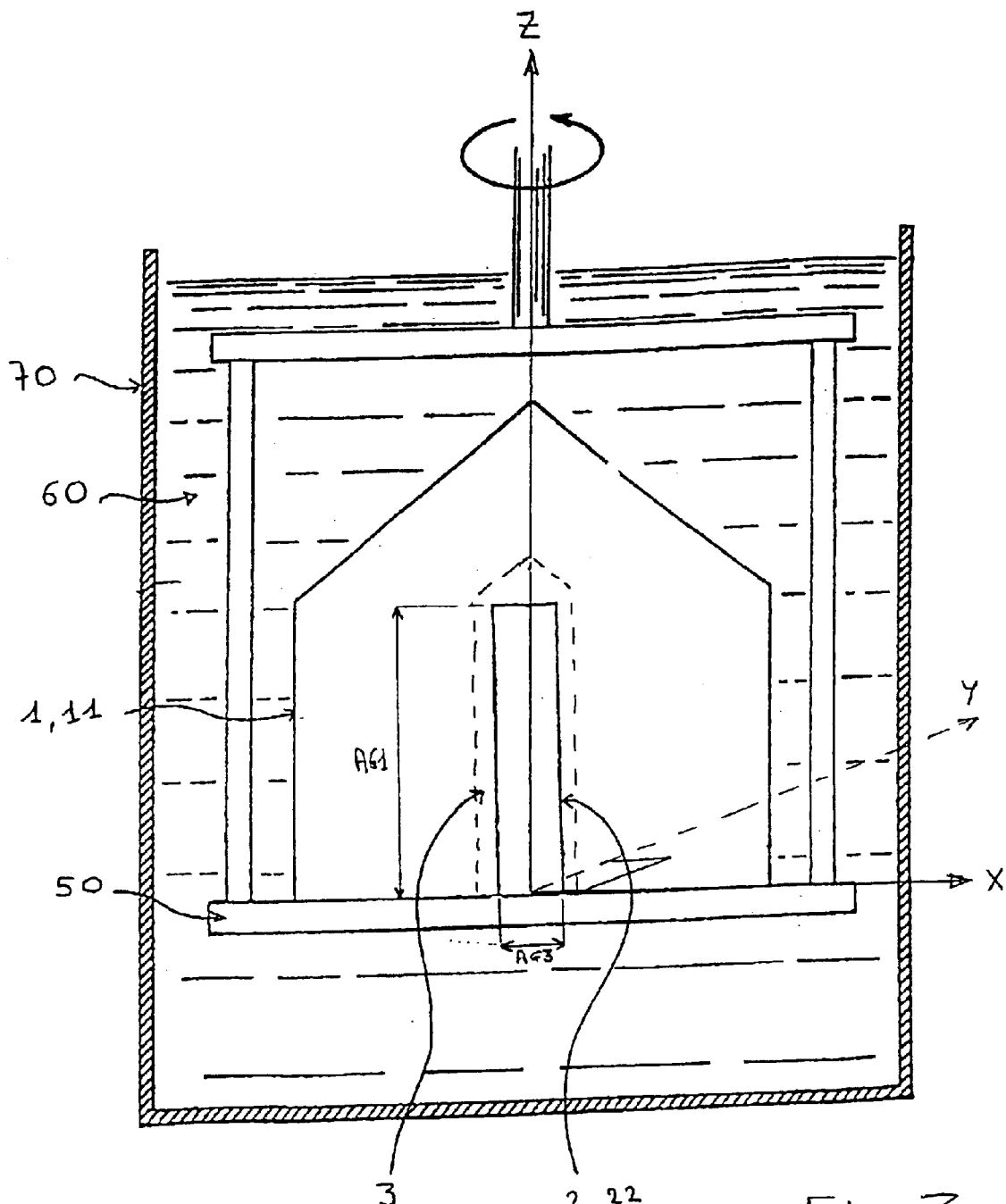

Further advantageous details and features of the invention will become apparent below from the description of illustrative examples of the invention, with reference to the appended figures which show:

FIG. 1: a perspective view of a single crystal according to the invention, obtained from a "rod seed";

FIG. 2: a perspective view of a single crystal according to the invention, obtained from a "plate seed";

FIG. 3, a sectional view of an apparatus suitable for the method of growing a single crystal according to the invention;

FIG. 4: a view of a single crystal according to the invention and of the region from which a single crystal usable as a frequency doubler can be cut:

FIG. 4.1: a sectional view
FIG. 4.2: a top view;
FIG. 5: a view of a single crystal according to the invention and of the region from which a single crystal usable as a frequency tripler can be cut:
FIG. 5.1: a sectional view
FIG. 5.2: a top view FIG. 1 shows a perspective view of a single crystal according to the invention. The single crystal 1 is composed of a parallelepiped, the edges of the faces of which have, as lengths, AC1, AC2 and AC3, the said parallelepiped being topped by a pyramid 4.

The figure shows the seed 2 from which the single crystal 1 was grown. This seed 2 is shown in solid lines in order to make the drawing easier to understand, although it lies at the core of the single crystal 1, with a lower face on the same plane as the lower face of the single crystal 1. This seed 2 is a parallelepiped, the two edges AG2 and AG3 of which are of much smaller length than the edge AG1. According to the invention AG2 and AG3 are less than or equal to one fifth, or even one tenth, of AG1. The seed is then referred to as a "rod seed".

It should be noted that, in the case of the crystals according to the invention, it is generally possible to visually detect the presence and the dimensions of the seed 2 in the crystal 1 which has been grown. This is because crystals of the family of $Z(H,D)_2MO_4$ compositions, as defined above, are transparent in the visible and/or ultraviolet and/or infrared range and there are slight optical defects at the border of the faces of the seed 2 in the crystal 1 which make it possible to characterize, unambiguously, the seed 2 from which the crystal was grown.

FIG. 2 shows a perspective view of another single crystal according to the invention. The considerations made above in regard to FIG. 1 also apply to FIG. 2. The difference between the crystal in FIG. 1 and that in FIG. 2 relates to the shape of the seed used. The seed 22 in FIG. 2 is a parallelepiped, the edges AG1 and AG3 of which are longer than the edge AG2. The seed is then referred to as a "plate seed". According to the invention, the longest two edges AG1 and AG3 have a length greater than or equal to five times, or even ten times, that of the edge AG3. The single crystal 11 obtained from this seed 22 comprises a parallelepiped, the length of the edge AC3 of which is very much greater than that of the edge AC2.

FIG. 3 shows the cross section through an apparatus suitable for implementing the process according to the invention. This apparatus comprises a crystallizer 70 in which a solution 60 may be introduced. A platform 50, the size of which is generally slightly greater than that of the single crystal 1, 11 that it is desired to obtain, is used. This platform 50 is immersed in the solution 60 and rotated during the growth process. A seed 2, 22 is placed on the lower part of the platform. This seed 2, 22, shown here in cross section, may especially have the shape of a rod or a plate, as defined above.

In general, the seed 2, 22 is placed so that its edges correspond to the crystallographic axes X, Y, Z. In the case shown in FIG. 3, the seed 2, 22 is placed so that one of these long lengths lies along the Z axis and one of its short lengths along the X axis. This arrangement is in no way limiting and it is possible, depending on the crystals that it is desired to obtain, to place, for example, a long length of the seed 2, 22 along the X axis or the Y axis.

This arrangement is particularly advantageous as it allows large crystals to be rapidly obtained. This is because the crystals according to the invention have growth rates Vx, Vy, Vz of the same order of magnitude along the crystallographic axes X, Y, Z.

Let us consider an average growth rate V and compare the results obtained with those obtained from a conventional point seed. A point seed is a parallelepiped which has each edge approximately of the same length and which corresponds, for example, approximately to the length AG3 shown in FIG. 3.

Under these conditions, using a point seed, after a time t a crystal is obtained which has edges of the base in contact with the platform 50 each of length AG3+2Vt and a total height of AG3+Vt.

With the process according to the invention, after the same time t a crystal is obtained which has edges of the base in contact with the platform 50 of length AG3+2Vt and AG2+2Vt and a height of AG1+Vt.

In this way, a crystal of significantly greater height is obtained with the process according to the invention than with the conventional process starting from a point seed. Likewise, it is possible to obtain a length of one edge of the base which is very long, if it is chosen to use a plate seed.

Crystals can thus be obtained whose geometry makes it possible to cut a much larger number of plates for optical components than with the reference method, assuming that the single crystals were grown using an equivalent apparatus and under the same growth conditions.

In some cases, as the examples which follow illustrate, it is possible to obtain at least ten times more plates from a crystal according to the invention than from a crystal obtained using the reference method.

The extraction yield is considerably increased, especially by a factor of at least three.

This results in substantial manufacturing cost savings.

It should be noted that the growth rate of the crystal may be controlled by varying the supersaturation parameter σ of the solution 60. The higher this parameter, the more rapid the growth.

It is possible to cut single-crystal plates usable as optical components from the crystals obtained.

This cutting is carried out in the volume of the crystal 1, 11, away from the volume of the seed 2, 22 and away from a regeneration region 3 which lies in the immediate vicinity of the faces of the seed 2, 22.

FIG. 4 shows a single crystal 1 according to the invention, illustrating the region from which a single-crystal plate 100 usable as a frequency doubler can be cut.

In the case shown, a rod seed 2 was used to grow the crystal 1. Other seeds, as defined according to the invention, may also be used.

FIG. 4.1 shows a cross section of the single crystal 1, in which the seed 2 surrounded by the regeneration region 3 may be seen. FIG. 4.2 shows a top view in which the plate is depicted in solid lines in order to make the figure easier to understand, with its hidden edge in a broken line. To obtain a plate 100 usable as a frequency doubler, a cut is made in a plane at 41° to the XY plane and intersecting the XY plane at points equidistant from the origin along the X axis and along the Y axis. A plate 100 of lengths a, b, c is thus obtained.

FIG. 5 shows a single crystal 1 according to the invention from which a plate 200 usable as a frequency tripler may be cut. The nonlimiting considerations and conditions made with regard to FIG. 4 apply to FIG. 5. To obtain a plate 200 usable as a frequency tripler, a cut is made in a plane at 59° to the XY plane and intersecting this XY plane along a line parallel to the X axis.

To illustrate the advantages of the crystals and of the processes according to the invention, a comparative example will be described.

The crystal obtained under identical growth conditions, with the same apparatus and the same solution, according to the reference method and according to the teachings of the invention will be compared.

An apparatus comprising a glass crystallizer one meter in diameter and a platform 850 mm in diameter is used.

As mentioned above, these elements of the apparatus have dimensions which can be exceeded, but which would result in very substantial additional costs.

With such a platform, it is possible to obtain crystals with a square base having sides of greater than 600 mm.

A supersaturated KDP solution is used, which results in the following growth rates:

$V_{vertical} = V_z = 9$ mm/day $V_{horizontal} = V_x = V_y = 6$ mm/day

The growth rates may vary by about 10%.

Example Ex1, according to the reference method, is that of a crystal obtained from a 10×10×10 mm$^3$ point seed.

Example Ex2, according to the invention, is that of a crystal obtained from a 10×10×150 mm$^3$ rod seed placed with its smallest face in contact with the platform.

Under these conditions, the horizontal growth rate of the two crystals is identical and the maximum size is reached after 50 days.

After this time, the Ex1 crystal has a height of 450 mm and the Ex2 crystal has a height of 600 mm.

This difference is extremely important as it allows many more useful crystals to be extracted from Ex2 than from Ex1.

In point of fact, in the practical case of the French power laser project MEGAJOULE, frequency doublers having at least a=405 mm, b=420 mm, c=12 mm have to be obtained. It is possible to extract, from crystals obtained according to Ex1 and taking into account the dimensional variations, one such frequency doubler plate in only about one Ex1 crystal in three. It is therefore necessary to wait on average 150 days in order to obtain such a frequency doubler plate using the reference method.

It is possible to extract between 5 and 7 frequency doubler plates defined above from a crystal obtained according to Ex2. Thus, it is possible according to the invention to obtain at least 15 doubler plates in the period of 150 days needed to obtain a single plate according to the reference method.

An equivalent comparison may be developed for obtaining frequency tripler plates of the same size as the above frequency doublers.

It should be noted that, thanks to the teaching of the invention, it is possible to obtain a large number of plates for components, while keeping reasonable dimensions of the growth apparatus, and that this very substantial increase in the number of plates coming from a boule is obtained by a moderate increase in the height of the boule (an increase in height of about one third). Thus, very advantageous savings of material are obtained, since at best about 10% of the volume of the boule can be exploited with the reference method, whereas more than 30% of the volume of the boule can be exploited with the method according to the invention.

The comparison between these examples clearly demonstrates the considerable increase in useful volume for cutting plates, and therefore an equivalent increase in the production yield of plates usable as optical components, that the invention allows.

The invention is not limited to these particular embodiments and must be interpreted in a nonlimiting manner as encompassing any tetragonal single crystal of composition:

$$Z(H,D)_2MO_4$$

where Z is an element or a group of elements, or a mixture of elements and/or of groups of elements chosen from the group K, N(H,D)$_4$, Rb, Ce
where M is an element chosen from the group P, As and
where (H,D) is hydrogen and/or deuterium
comprising an approximately parallelepipedal region of large size, especially one in which the length of each of the edges of the faces, AC1, AC2, AC3, is greater than or equal to 200 mm, in particular greater than or equal to 500 mm, obtained by crystal growth from solution, from an approximately parallelepipedal single-crystal seed (2, 22), the edges of the faces of which have lengths of AG1, AG2, AG3, characterized in that at least the length of one edge, AG1, of the seed is greater than or equal to one tenth, preferably one quarter, of the length of one edge of the faces of the single crystal and that at least one other dimension of the seed, AG3, is less than or equal to one fifth, preferably one tenth, of the greatest length of the edges of the faces of the seed.

The invention also relates to the growth process which allows such crystals to be obtained, but which can be used nonlimitingly to grow any tetragonal single crystal whose growth rates are of the same order of magnitude along the principal crystallographic axes.

The preferred crystals are those of the "KDP family".

What is claimed is:

1. A process for manufacturing a tetragonal single crystal (1, 11) by growth from solution, from an approximately parallelepipedal single-crystal seed (2, 22), the edges of the faces of which have lengths of AG1, AG2 and AG3, which is supported on a platform (50) immersed in the solution (60) and set in rotation, said single crystal (1, 11) having growth rates (Vx, Vy, Vz) of the same order of magnitude along the principal crystallographic axes (X, Y, Z), characterized in that it comprises at least the following steps:

the seed is cut from a single crystal so that at least one length of the edges, AG3, of the seed is less than or equal to one fifth of the greatest length of the edges of the seed, AG1, and so that at least one length of the edges of the seed is greater than or equal to 25 mm, the seed is positioned on the platform (50) in the desired orientation; and the platform (50) with the seed (2, 22) is put into a crystallizer (70) containing the solution (60) and then set in rotation, in order to carry out the growth of the single crystal (1, 11).

2. The process as claimed in claim 1, wherein the growth rates (Vx, Vy, Vz) are such that the slowest growth rate is greater than or equal to one quarter of the fastest growth rate.

3. The process as claimed in claim 2, wherein the slowest growth rate is greater than or equal to one half of the fastest growth rate.

4. The process as claimed in claim 1, wherein at least one length of the edges, AG3, of the seed is less than or equal to one tenth of the longest edge, AG1, of the seed.

5. The process as claimed in claim 1, wherein at least one length of the edges of the seed is greater than or equal to 50 mm.

6. The process as claimed in claim 1, wherein the seed is a rod (2), the lengths of the two shortest edges of which, AG2, AG3, are approximately equal to each other and less than or equal to one fifth of the length of the longest edge, AG1, of the rod.

7. The process as claimed in claim 1, wherein the lengths of the two smallest edges, AG2, AG3, are approximately equal to each other and less than or equal to one tenth of the length of the longest edge, AG1, of the rod.

8. The process as claimed in claim 1, wherein the seed is a plate (22), the lengths of the two longest edges of which, AG3, AG1, are approximately equal to each other and greater than or equal to five times the length of the shortest edge, AG2, of the plate.

9. The process as claimed in claim 1, wherein the lengths of the two longest edges, AG3, AG1, are approximately equal to each other and greater than or equal to ten times the length of the smallest edge, AG2, of the plate.

10. The process as claimed in claim 1, wherein the single-crystal seed (2, 22) is a tetragonal single crystal of composition Z(H,D)$_2$MO$_4$, where Z is an element or a group of elements, or a mixture of elements and/or of groups of elements chosen from the group K, N(H,D)$_4$, Rb, Ce, where M is an element chosen from the group P, As and where (H,D) is hydrogen and/or deuterium.

11. The process as claimed in claim 1, wherein the tetragonal single crystal (1, 11) obtained by growth from solution has the same chemical composition as the single-crystal seed (2, 22).

12. The process as claimed in the solution is supersaturated, especially with a supersaturation σ of between 0.1% and 20%.

13. The process as claimed in claim 1, wherein the single crystal (1, 11) obtained is of composition Z(H,D)$_2$MO$_4$, where Z is an element or a group of elements, or a mixture of elements and/or of groups of elements chosen from the group K, N(H,D)$_4$, Rb, Ce, where M is an element chosen from the group P, As and where (H,D) is hydrogen and/or deuterium.

14. The process as claimed in claim 13, wherein the single crystal comprises an approximately parallelepipedal region of large size, especially one in which the length of each of the edges of the faces, AC1, AC2, AC3, is greater than or equal to 500 mm.

15. A process for manufacturing at least one tetragonal single crystal (100, 200), characterized in that a single crystal (1, 11) obtained using the process as claimed in claim 1 is used and in that at least one single-crystal plate (100, 200) is cut from a region sufficiently far from the seed (2, 22) and from the regeneration region (3) in order to obtain optical properties allowing the plate(s) (100, 200) to be used as a laser component.

16. A single crystal that can be obtained by the process of claim 1.

17. A tetragonal single crystal (1, 11) of composition Z(H,D)$_2$MO$_4$, where Z is an element or a group of elements, or a mixture of elements and/or of groups of elements chosen from the group K, N(H,D)$_4$, Rb, Ce, where M is an element chosen from the group P, As and where (H,D) is hydrogen and/or deuterium comprising an approximately parallelepipedal region of large size, especially one in which the length of each of the edges of the faces, AC1, AC2, AC3, is greater than or equal to 100 mm, obtained by crystal growth from solution, from an approximately parallelepipedal single-crystal seed (2, 22) whose edges of the faces have lengths of AG1, AG2, AG3, characterized in that at least the length of one edge, AG1, of the seed is greater than or equal to one tenth, preferably one quarter, of the length of one edge of the faces of the single crystal and in that at least one other length of the seed, AG3, is less than or equal to one fifth, preferably one tenth, of the greatest length of the edges of the faces of the seed.

18. The single crystal as claimed in claim 17, wherein each of the edges of the faces, AC1, AC2, AC3, is greater than or equal to 200 mm.

19. The single crystal as claimed in claim 18, wherein each of the edges of the faces, AC1, AC2, AC3, is greater than or equal to 500 mm.

20. The single crystal (1) as claimed in claim 17, wherein the seed is a rod (2), the two lengths of the shortest edges of which, AG2, AG3, are approximately equal to each other and less than or equal to one fifth, preferably one tenth, of the length of the longest edge, AG1, or the rod.

21. The single crystal (11) as claimed in claim 17, wherein the seed is a plate (22), the lengths of the two longest edges of which, AG3, AG1, are approximately equal to each other and greater than or equal to five times, preferably ten times, the length of the shortest edge, AG2, of the plate.

22. The single crystal as claimed in claim 17, wherein the single-crystal seed (2, 22) is a tetragonal single crystal of composition $Z(H,D)_2MO_4$, where Z is an element or a group of elements, or a mixture of elements and/or of groups of elements chosen from the group K, $N(H,D)_4$, Rb, Ce, where M is an element chosen from the group K, $N(H,D)_4$, Rb, Ce, where M is an element chosen from the group P, As and where (H,D) is hydrogen and/or deuterium.

23. The single crystal (1, 11) as claimed in claim 22, wherein the single crystal (1, 11) and the single-crystal seed (2, 22) have the same chemical composition.

24. The use of a single-crystal plate obtained by the process of claim 15 as a Pockels cell.

25. The use of a single-crystal plate (100) obtained by the process of claim 15 as a frequency doubler.

26. The use of a single-crystal plate (200) obtained by the process of claim 15 as a frequency tripler.

* * * * *